United States Patent
Wu et al.

(10) Patent No.: US 8,030,126 B2
(45) Date of Patent: Oct. 4, 2011

(54) PRINTING PROCESS FOR ENHANCED JETTED PERFORMANCE OF SEMICONDUCTOR LAYER

(75) Inventors: Yiliang Wu, Ontario (CA); Stephan Drappel, Ontario (CA); Nan-Xing Hu, Ontario (CA); Paul F. Smith, Ontario (CA)

(73) Assignee: Xerox Corporation, Norwalk, CT (US)

( * ) Notice: Subject to any disclaimer, the term of this patent is extended or adjusted under 35 U.S.C. 154(b) by 21 days.

(21) Appl. No.: 12/560,032

(22) Filed: Sep. 15, 2009

(65) Prior Publication Data
US 2011/0065232 A1    Mar. 17, 2011

(51) Int. Cl.
*H01L 51/40* (2006.01)

(52) U.S. Cl. ...... 438/99; 438/82; 438/780; 257/E51.024
(58) Field of Classification Search ................ 438/99, 438/82, 780
See application file for complete search history.

(56) References Cited

U.S. PATENT DOCUMENTS
2007/0128764 A1 *  6/2007  Tomino et al. ................. 438/99
* cited by examiner

*Primary Examiner* — Alexander Ghyka
(74) *Attorney, Agent, or Firm* — MH2 Technology Law Group LLP

(57) ABSTRACT

Exemplary embodiments provide materials and processes for forming organic semiconductor features by heating a liquid composition containing semiconductor particles into a Newtonian solution for a uniform deposition.

13 Claims, 6 Drawing Sheets

PRINTING PROCESS FOR ENHANCED JETTED PERFORMANCE OF SEMICONDUCTOR LAYER

DETAILED DESCRIPTION

1. Field of Use

The present teachings relate generally to organic semiconductors and, more particularly, to materials and methods for organic semiconductors having enhanced printing performance.

2. Background

Semiconductor technology has played an important role in the development of electronic circuits over the past several decades. Two examples of semiconductor technology include complementary metal oxide semiconductor (CMOS) processing technology and organic semiconductor processing technology.

Organic semiconductor processing technology was developed more recently, wherein organic materials that exhibit semiconducting properties are used to fabricate electronic and optoelectronic devices on substrates that are rigid or flexible.

Compared to CMOS processing technology, organic semiconductor processing technology is cheaper to implement and more suitable to specific applications such as flexible electronics and displays. This is particularly advantageous for large area displays and low-cost RFID tags.

Conventional methods for forming organic semiconductors include printing a particle-containing dispersion onto a substrate. The printable dispersion is often a non-Newtonian fluid, in which the viscosity changes with applied strain rate. Such dispersion having a viscosity that is not well defined may cause poor jetted performance during printing. For example, significant offsets from original design are often observed for the printed organic semiconductor features, including non-uniform or broken line or patterns, rough edges, etc.

Thus, there is a need to overcome these and other problems of the prior art and to improve deposition performance of organic semiconductor features.

SUMMARY

According to various embodiments, the present teachings include a process for forming a semiconductor feature by first providing a liquid composition that includes one or more organic semiconductors. The liquid composition can then be converted from a non-Newtonian form at a first temperature to a Newtonian form at a second temperature. The converted liquid composition in the Newtonian form can then be deposited on a substrate to form one or more semiconductor features.

According to various embodiments, the present teachings also include a process for forming a semiconductor feature. In this method, a liquid composition that includes a plurality of organic semiconductor particles dispersed in a solvent can be formed to have a shelf-life of more than about two days. The liquid composition can then be heated so as to uniformly dissolve the plurality of organic semiconductor particles in the solvent to form a Newtonian liquid composition, which can then be printed onto a substrate to form one or more uniform semiconductor features.

Additional objects and advantages of the present teachings will be set forth in part in the description which follows, and in part will be obvious from the description, or may be learned by practice of the present teachings. The objects and advantages of the present teachings will be realized and attained by means of the elements and combinations particularly pointed out in the appended claims.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate several embodiments of the present teachings and together with the description, serve to explain the principles of the present teachings.

It should be noted that some details of the FIGS. have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

Exemplary embodiments provide materials and processes for forming organic semiconductor features. In one embodiment, the formation of semiconductor features can include a rheological conversion of a liquid composition between a non-Newtonian "dispersion" having an un-defined viscosity and a Newtonian "solution" having a constant viscosity. In embodiments, uniform semiconductor features can be formed with improved deposition performance.

Figure 1:
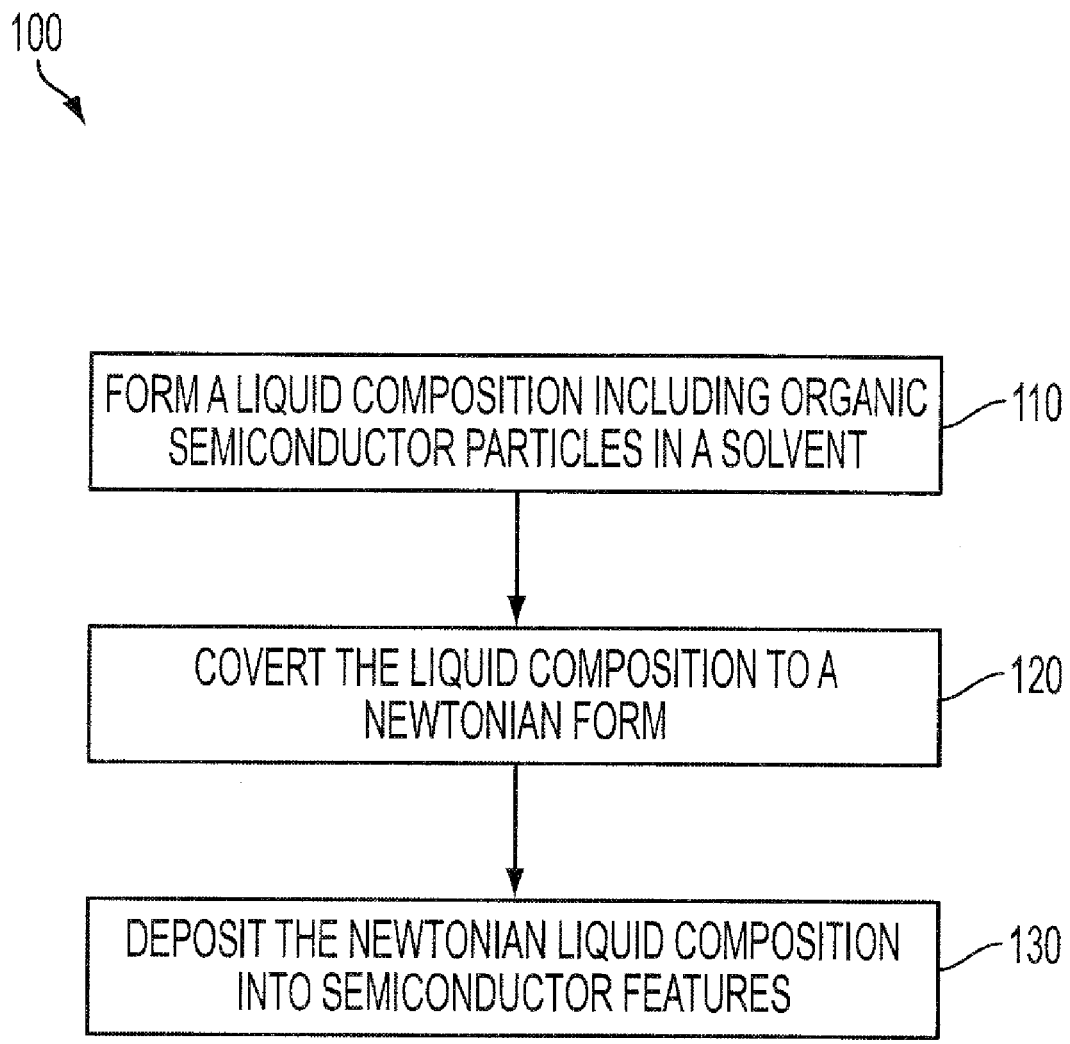
FIG. 1 depicts an exemplary method for forming an organic semiconductor feature in accordance with various embodiments of the present teachings.

FIG. 1 depicts an exemplary process for forming a semiconductor feature in accordance with various embodiments of the present teachings. While the process 100 of FIG. 1 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. Also, not all illustrated steps may be required to implement a methodology in accordance with one or more aspects or embodiments of the present invention. Further, one or more of the acts depicted herein may be carried out in one or more separate acts and/or phases.

At 110 of FIG. 1, a liquid composition can be formed by dispersing one or more semiconductor materials in a suitable organic solvent.

In embodiments, the semiconductor material can include one or more organic semiconductors having a formula (I) of the following:

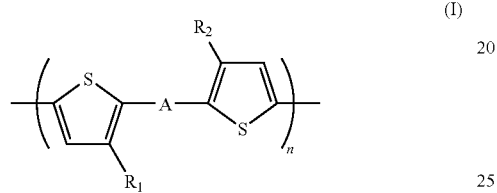

(I)

wherein A is a divalent linkage; R1 and R2 is independently selected from the group consisting of hydrogen, alkyl, arylalkyl, alkylaryl, perhaloalkyl, alkoxyalkyl, siloxy-substituted alkyl, polyether, alkoxy, and halogen; and n is from 2 to about 5,000.

In embodiments, the divalent linkage A of formula (I) can include a structure selected from the following:

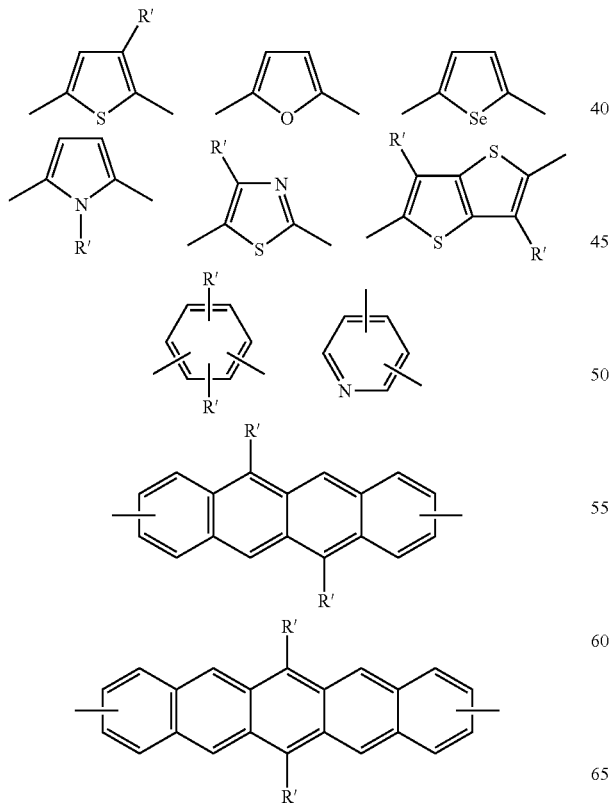

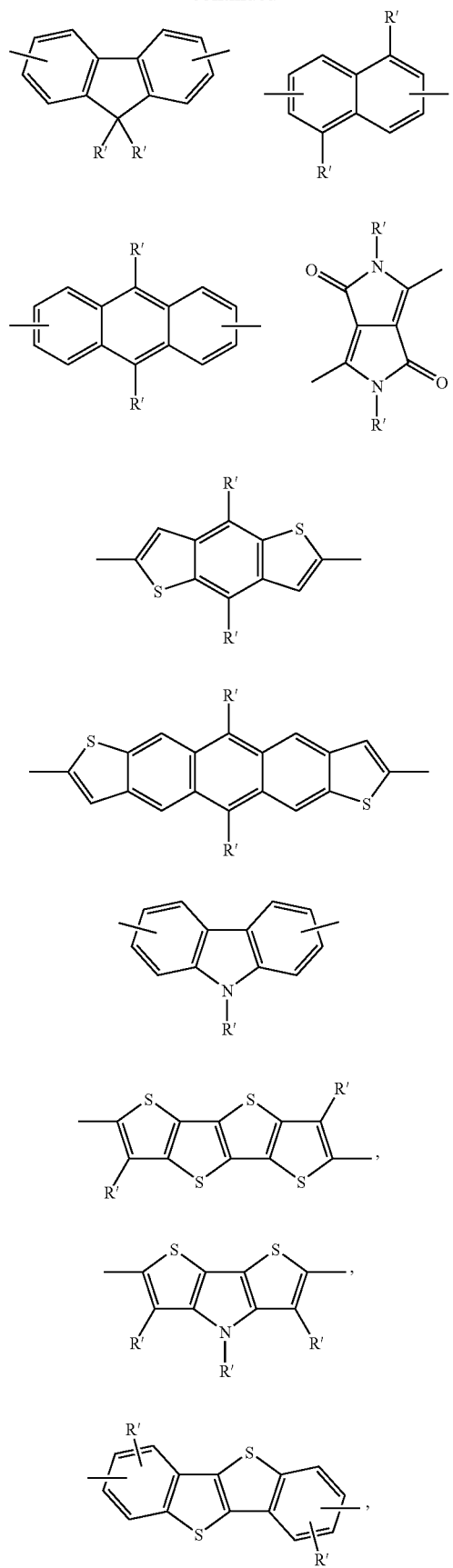

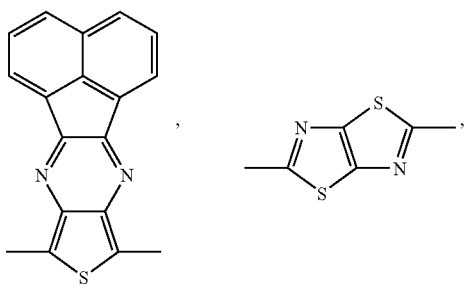
, 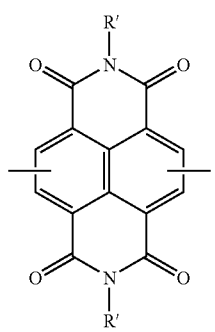,

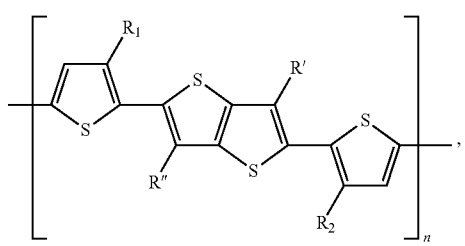

and combinations thereof, wherein each R' is independently selected from the groups consisting of hydrogen, alkyl, substituted alkyl, aryl, substituted aryl, heteroaryl, halogen, —CN, and —NO₂.

In further embodiments, the semiconducting material can include a compound having the following formula:

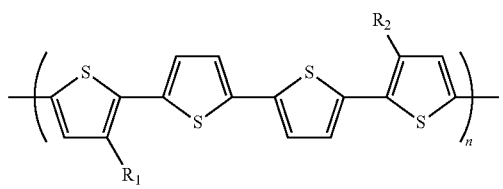 (II)

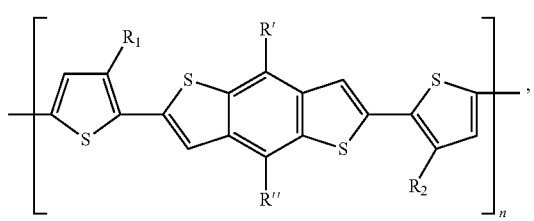 (III)

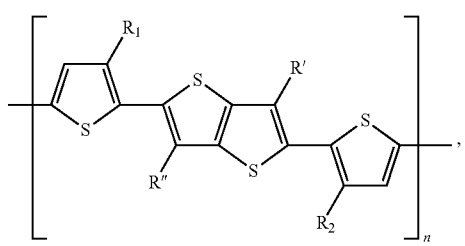 (IV)

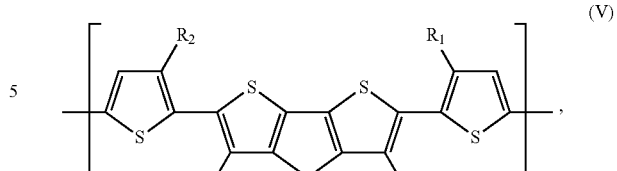 (V)

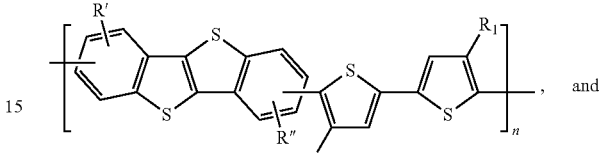 (VI)

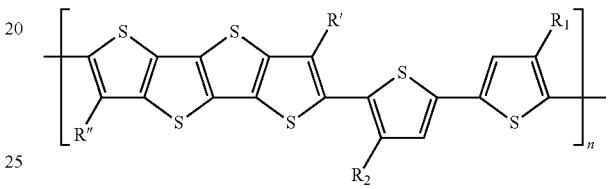 (VII)

wherein R1, R2, R', and R" are independently selected from i) hydrogen, ii) alkyl or substituted alkyl, iii) aryl or substituted aryl, iv) alkoxy or substituted alkoxy, v) a suitable hetero-containing group, vi) a halogen, or mixtures thereof; and n is an integer from about 2 to about 5,000, from about 2 to about 2,500, from about 2 to about 1,000, from about 100 to about 800, or from about 2 to about 100. The hydrocarbon can be alkyl, alkoxy, aryl, substituted derivatives thereof, and the like, inclusive of side-chains containing, for example, from zero to about 35 carbon atoms, or from about 1 to about 30 carbon atoms, or from about 1 to about 20 carbon atoms, or from about 6 to about 18 carbon atoms.

In embodiments, R1 and R2 can be the same or different and each independently selected from a long carbon side-chain containing from about 6 to about 30 carbon atoms, or from about 6 to about 20 carbon atoms; and R' or R" can be the same or different and each independently selected from a substituent containing from 0 to about 5 carbon atoms; or R1 and R2 can be each independently selected from a substituent containing from 0 to about 5 carbon atoms, and R' can be a long carbon side-chain containing from 6 to about 30 carbon atoms.

In embodiments, $R_1$ and $R_2$, R', and R" can independently be alkyl with about 1 to about 35 carbon atoms of, for example, methyl, ethyl, propyl, butyl, pentyl, hexyl, heptyl, octyl, nonyl, decyl, undecyl, dodecyl, tridecyl, tetradecyl, pentadecyl, hexadecyl, heptadecyl or octadecyl; or arylalkyl with about 7 to about 42 carbon atoms of, for example, methylphenyl (tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, and octadecylphenyl. In other embodiments, $R_1$, $R_2$, R' and R" can independently represent alkyl or substituted alkyl groups having from about 1 to about 35 carbon atoms.

In a specific embodiment, the semiconducting material can be a compound having the following formula;

(1)
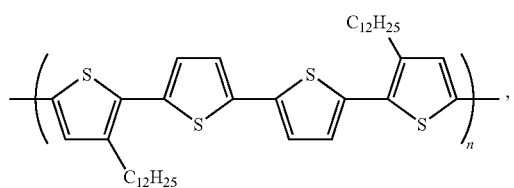

(2)
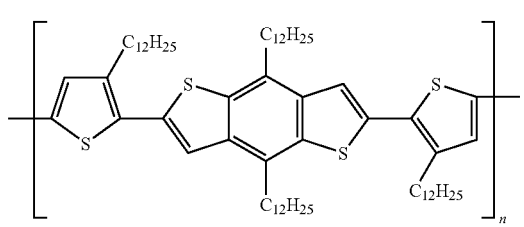

(3)
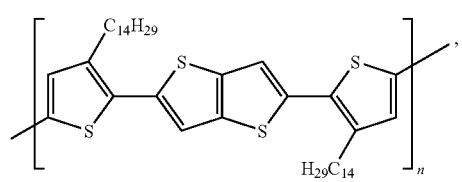

(4)
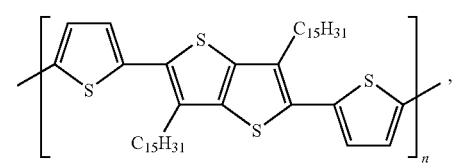

(5)
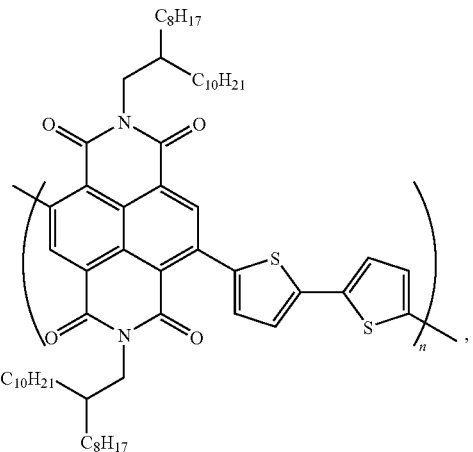

(6)
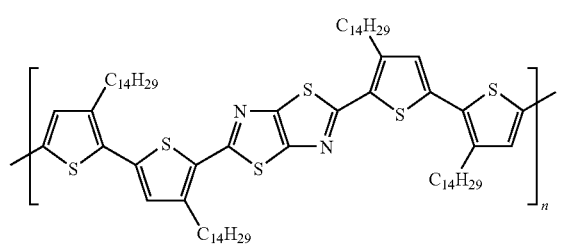

(7)
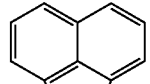
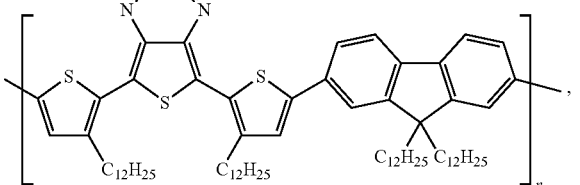

(8)
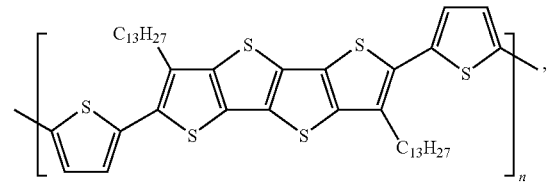

(9)
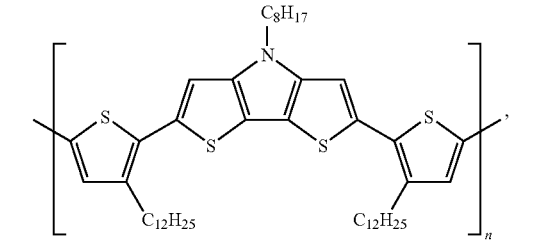

(10)
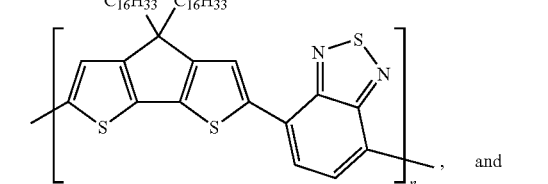

and

(11)
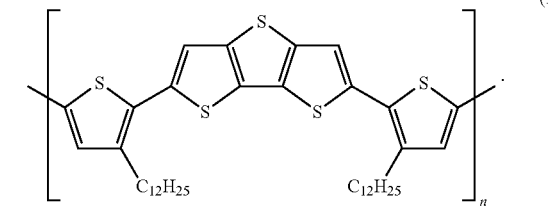

The number average molecular weight (Mn) of the polymers in embodiments can be, for example, from about 500 to about 400,000, including from about 1,000 to about 150,000, and the weight average molecular weight (Mw) thereof can be from about 600 to about 500,000, including from about 1,500 to about 200,000, both as measured by, for example, gel permeation chromatography using polystyrene standards.

In a specific embodiment, the semiconducting material can be a compound of the formula (1). In another specific embodiment, the semiconducting material can be a compound of the formula (2) to (5).

In embodiments, the type of solvent used can result in effective mixing or dispersion of the semiconductor materials in the solvent. In embodiments, the solvent can be an aromatic solvent. In some embodiments, the solvent can be a halogenated aromatic solvent. Exemplary halogenated aromatic solvents can include chlorobenzene, dichlorobenzene (1,2-dichlorobenzene, and 1,3-dichlorobenzene), trichlorobenzene, or chlorotoluene. In a specific embodiment, the solvent can include 1,2-dichlorobenzene. In some embodiments, the solvent can be a non-halogenated solvent. Exemplary non-halogenated aromatic solvents can include toluene, xylene, mesitylene, trimethylbenzene, ethylbenzene, tetrahydronaphthalene, and the like. In some embodiments, the solvent can be a non-aromatic solvent. Exemplary non-aromatic solvent can include chloroform, chloroethane, cyclohexane, bicyclohexyl and the like.

In an exemplary embodiment, the liquid composition can include poly(3,3'''-dialkyl-quaterthiophene) (PQT-12) dispersed in an exemplary solvent of dichlorobenzene.

In embodiments, in addition to organic semiconductors, the liquid composition can be formed to further include, for example, any suitable nanomaterials including, such as nanotubes, nanowires nanodots, quantum dots, nanorods, nanocrystals, nanotetrapods, nanotripods, nanobipods, nanoparticles, nanosaws, nanosprings, nanoribbons, and/or any other suitable nanomaterals or combination of nanomaterials to improve the carrier mobility and conductivity of the formed semiconductors.

In embodiments, high temperatures that are above ambient temperature (e.g., about 20-25° C.) can be used to facilitate the dispersion/dissolution of organic semiconductors in the solvent. This can be followed by a cooling process to form the liquid composition at the ambient temperature. In embodiments, any suitable processes, such as, for example, sonication or mechanical stirring, can be used to facilitate the dispersion/dissolution of organic semiconductors in the solvent.

For example, organic semiconductors can be dissolved in the solvent at an elevated temperature of, for example, up to about 80° C. depending on the organic semiconductors and the solvent used. The dispersion can then be formed by cooling the solution to room temperature (about 20-25° C.) to form the liquid composition, wherein the dissolved organic semiconductors aggregate, for example, into nano structures in the solvent. In embodiments, the dispersion can be ultra-sonicated, for example, during cooling.

In embodiments, organic semiconductors can form semiconductor particles, such as, semiconductor aggregates or semiconductor nanoparticles in the solvent. As a result, the formed liquid composition containing semiconductor particles can be non-Newtonian having an un-defined viscosity. That is, the viscosity of the liquid composition containing semiconductor particles can change as a shear force applies to the liquid composition.

In various embodiments, the non-Newtonian liquid composition containing semiconductor particles can be stable at a first temperature ranging from 0 to about 50° C., including the temperature from about 0° C. to about 40° C. or from about 20° C. to about 40° C. In addition, the non-Newtonian liquid composition containing semiconductor particles can have a long shelf-life, for example, at least about two days. Other embodiments can include a stable non-Newtonian liquid composition having a long shelf-life of, for example, up to about 1 year or longer. The stability of the non-Newtonian liquid composition at the first temperature can allow for easy storage and transfer prior to further processing.

In various embodiments, semiconductor particles in the non-Newtonian liquid composition can include various shapes, regular or irregular, and various dimensions. For example, the semiconductor particles can include aggregates in a nanometer scale having at least one minor dimension of about 1000 nm or less. In embodiments, the semiconductor nanoparticles in the non-Newtonian liquid composition can be in various forms, regular or irregular, including, but not limited to, nanotubes, nanofibrils, nanorods, nanobelt, nanoshafts, nanopillars, nanowires, nanoneedles or their combinations.

In various embodiments, from about 0.5% to about 100% of the semiconductor in the non-Newtonian liquid composition can be nano aggregates. In some embodiments, at least about 30% of the semiconductor in the non-Newtonian liquid composition can be nano aggregates. In other embodiments, from about 50% to about 80% of semiconductor in the non-Newtonian liquid composition can be nano aggregates.

In various embodiments, if non-Newtonian liquid composition containing the semiconductor particles is directly deposited onto a substrate, for example, jetted onto the substrate, undesired defects may be observed because the shear viscosity of the non-Newtonian liquid composition may change in the print-head when being jetted at high frequency.

At 120, the non-Newtonian liquid composition formed at step 110 can be temporarily converted into a Newtonian liquid composition. That is, stress versus rate of strain curve of the liquid composition can be linear and pass through the origin. The Newtonian liquid composition can thus have a constant viscosity determined by constant of that proportionality.

Various techniques can be used to conduct such rheological conversion of the liquid composition. For example, the non-Newtonian liquid composition can be converted into a Newtonian liquid composition by a heating process, or other suitable processes, in embodiments. The heating process can be conducted, for example, using elevated temperatures or in a step-wise manner. In embodiments, the heating temperature can be selected depending on a conversion temperature between a non-Newtonian state and a Newtonian state of certain liquid compositions.

In various embodiments, the conversion temperature can in turn be determined by, e.g., measuring the rheological properties of the liquid composition. For example, an oscillatory measurement can be used to measure the complex viscosity of a non-Newtonian liquid composition as function of the temperature. The conversion temperature can be a starting temperature or a temperature range when the complex viscosity of the liquid composition becomes constant, which means the liquid composition becomes a uniform Newtonian solution. During this conversion, semiconductor particles can be uniformly or completely dissolved in the solvent and, in some cases, no aggregates or particles can be observed in the uniform Newtonian solution. In certain embodiment, the Newtonian solution can be substantially absent of aggregates or particle of the organic semiconductor.

In various embodiments, the non-Newtonian liquid composition can be heated to a second temperature. The second temperature can be the conversion temperature (or the conversion temperature range) or be greater than the conversion temperature (or the conversion temperature range) of a specific liquid composition. In exemplary embodiments, the non-Newtonian liquid composition can be heated at elevated temperatures from about 20° C. to about 120° C. or in some cases from about 40° C. to about 120° C. In other exemplary embodiments, the non-Newtonian liquid composition containing semiconductor particles can be heated for a conversion at elevated temperatures ranging from about 45° C. to about 80° C.

The non-Newtonian liquid composition containing semiconductor particles can then be converted into a uniform solution of Newtonian liquid composition.

In embodiments, such conversion can be performed in a time period of, for example, less than about 1 hour. In some embodiments, the conversion from a non-Newtonian form to a Newtonian form can take about 30 minutes less and in some embodiments about 10 minutes or less. In further embodiments, quick conversion can be achieved of about 1 minute or less.

In embodiments, after the conversion, the Newtonian liquid composition can be equilibrated for a period of time, such as about 1 hour or less. In some embodiments, the Newtonian liquid composition can be equilibrated for about 30 minutes less or in some embodiments about 10 minutes or less. In other embodiments, the Newtonian liquid composition can be equilibrated for about 1 minute or less. In embodiments, the liquid composition can be kept at the second temperature for a short time so as to avoid the degradation of organic semiconductors.

In various embodiments, other conversion temperatures, conversion temperature ranges, and/or equilibration times can be used, depending on materials and methods used for the liquid composition.

In various embodiments, the heating can be performed by using a heater, for example, an oven, a radiant energy source, a thermocouple, or a combination thereof.

At 130 of FIG. 1, the Newtonian liquid composition can be deposited into semiconductor features on a substrate. The deposited semiconductor features can then be solidified or dried, for example, by an evaporation or a heating process. Various semiconductor features, such as semiconductor layers, patterns, lines or dots, can then be formed.

In various embodiments, the deposition can be performed using a printing or a coating technique. Exemplary printing techniques can include inkjet printing, lithographic or offset printing, flexographic printing, screen printing, stencil printing, stamping, micro-contact printing, gravure, and the like. Exemplary coating techniques can include spin coating, blade coating, rod coating, dip coating, and the like. In one embodiment, the deposition can be inkjet printing.

In embodiments, during deposition of the Newtonian liquid composition, a predetermined array can be designed in order to form an array of semiconductor features including for example, the semiconductor layers, patterns, lines or dots as described above.

In embodiments, each semiconductor feature in the resulting array may have an offset, i.e., a center-to-center spacing, from its original design. In embodiments, the offset can range from 0 to about 30 microns, or in some embodiments, from 0 to about 20 microns. In other embodiments, the offset between a formed semiconductor feature and its original design can be less than about 10 microns.

Figure 2:
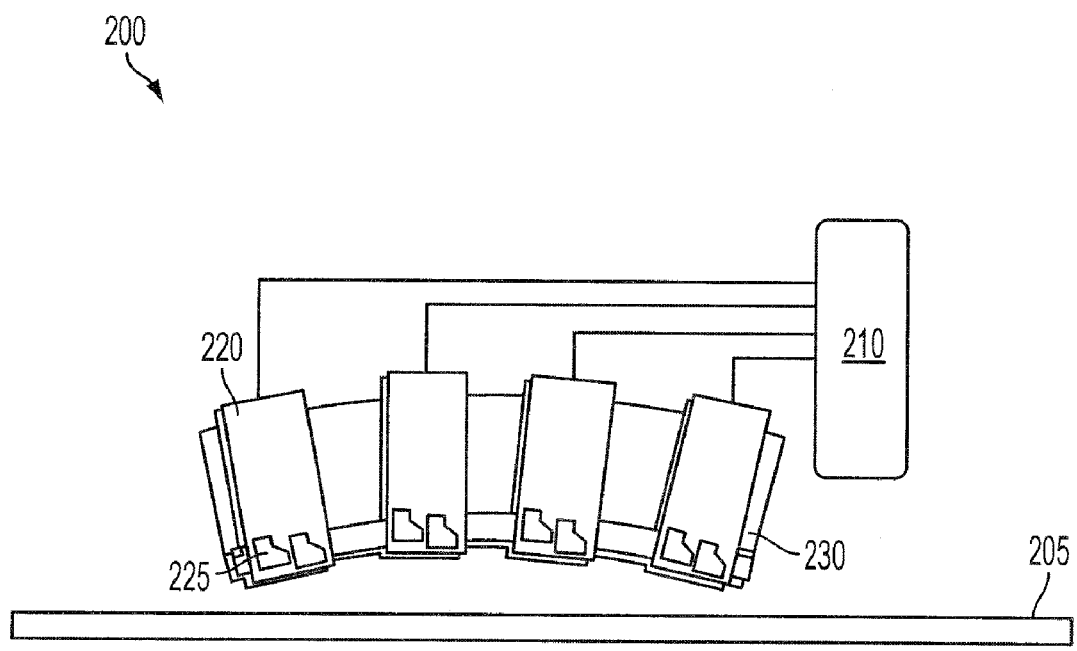
FIG. 2 depicts an exemplary printing system for forming an organic semiconductor feature in accordance with various embodiments of the present teachings.

FIG. 2 depicts an exemplary system 200 for printing semiconductor features in accordance with various embodiments of present teachings. It should be readily apparent to one of ordinary skill in the art that the system 200 depicted in FIG. 2 represents a generalized schematic illustration and that other components/devices can be added or existing components/devices can be removed or modified.

As shown in FIG. 2, the system 200 can include a printable substrate 205, and a printing station including a cartridge 210, one or more print-heads 220 each having a jet nozzle 225, and a heater 230.

The cartridge 210 can be used for supplying ink dispersion, in embodiments, such as the non-Newtonian liquid composition containing semiconductor particles.

The heater 230 can be configured with the print-heads 220 and/or the jet nozzle 225 so as to heat the non-Newtonian liquid composition that passes the print-heads 220 and/or the jet nozzle 225. In this manner, the non-Newtonian liquid composition dispersion containing semiconductor particles can be converted in-situ into a Newtonian liquid composition solution.

In embodiments, due to the Newtonian feature of the liquid composition, the occurrence of clogging of the ink-jet nozzles can be minimized, and the uniformity of the printing or the jetting as well as the uniformity of deposited semiconductor features can be achieved.

The heated non-Newtonian liquid composition, converted to a Newtonian liquid composition through the heating, can then be jetted through the jet nozzle 225 onto a printable substrate 205. The printable substrate 205 can be configured to receive the jetted liquid composition to form semiconductor features through, for example, a drying process.

In one embodiment, prior to the deposition of the Newtonian liquid composition, the surface of the printable substrate can be chemically treated or mechanically rubbed. In embodiments, the printable substrate can be an organic substrate, an inorganic substrate, a flexible substrate or a rigid substrate. In embodiments, the printable substrate can include, for example, glass, silicon (including electrode bearing silicon substrates), polyimide, polyethylene terephthalate (PET), poly(ethylenenaphthalate) (PEN), indium tin oxide (ITO), or any other suitable substrate.

In embodiments, the substrate can be at a third temperature. The third temperature can be, for example, from about 0 to about 120° C., including from about 20° C. to about 80° C. or from about 20° C. to about 40° C. In further embodiments, the third temperature can be similar to the first temperature, for example, to be lower than the conversion temperature of the liquid composition. In other words, the Newtonian fluid can become non-Newtonian fluid when it reaches the substrate. That is, nano-aggregates or gel can be re-formed at the substrate. In view the whole process, the liquid composition can undergo a phase change from non-Newtonian state (having nano aggregates phase, or the dispersion phase) to a Newtonian state (substantially absent of nano aggregates in the solution phase), and back to non-Newtonian state (having nano aggregates phase, or the dispersion phase). This phase change printing process can enable high accuracy jetting at Newtonian state, and low spreading or well confined drops of the liquid composition upon the substrate due to the reversion to the non-Newtonian state. The feature of non-Newtonian ink fluid having high viscosity at low shear rate can facilitate to confine the ink drops and to reduce spreading.

In embodiments, the process 100 and/or system 200 disclosed herein can be used for forming devices such as, for example, transistors, sensors, light emitting diodes, photovoltaic devices, or any other suitable device or combination of devices. The following examples are illustrative of the invention and its advantageous properties, and are not to be taken as limiting the disclosure or claims in any way.

EXAMPLES

Example 1

Organic Semiconductor PQT

Organic semiconductor PQT was used as an exemplary organic semiconductor for forming semiconductor features. The organic semiconductor PQT had the following structure:

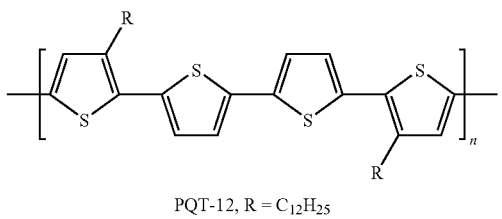

PQT-12, R = $C_{12}H_{25}$

Example 2

PQT-Dispersion or Non-Newtonian Liquid Composition Containing PQT Semiconductor Particles The non-Newtonian liquid composition containing PQT semiconductor particles was prepared by dissolving PQT-12 semiconductor in a solvent of 1,2-dichlorobenzene at an elevated temperature of up to about 80° C., followed by a cooling process. During cooling, the particle dispersion was sonicated. Purple color dispersion containing PQT and/or nano-PQT particles was obtained, which was very stable at room temperature, for example, having a shelf-life over about 1 year.

Rheological properties of the PQT-dispersion were measured using RFS3 Fluids Spectrometer (TA Instruments, New Castle, Del.) with a cone and plate geometry. Ti (titanium) based cone was used with a nominal cone angle of 0.02 radians and a gap of 48.3 microns.

Figure 3:
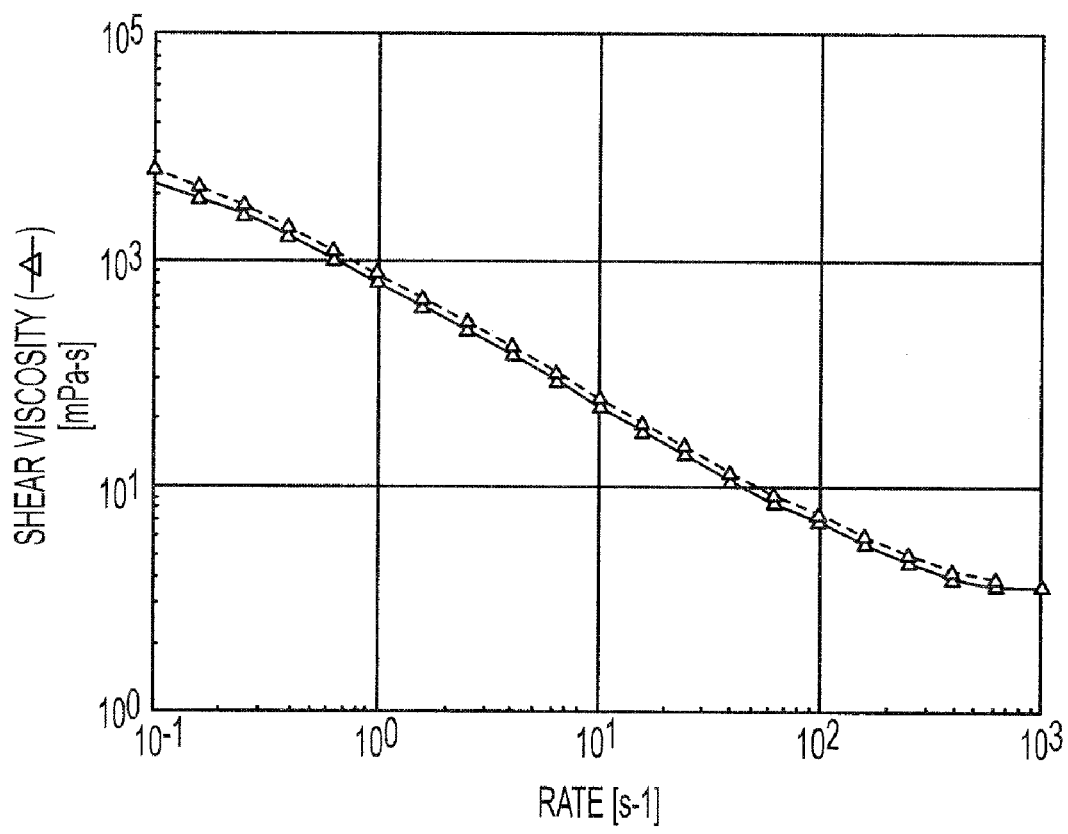
FIG. 3 depicts an exemplary rheological test result for an exemplary non-Newtonian liquid composition in accordance with various embodiments of the present teachings.

A steady rate sweep test was performed for the PQT-dispersion at about 25° C. and at a frequency ranging from 1 to 1000 $s^{-1}$. FIG. 3 shows measured results, which indicate that the PQT-dispersion is a non-Newtonian fluid. Specifically, FIG. 3 shows the PQT-dispersion has a shear thinning property (or a pseudoplastic property), i e., having high viscosity (e.g., over 100 cps) at low shearing rates and having low viscosity (e.g., about 2-3 cps) at high shearing rates (e.g., about $10^3$ $s^{-1}$).

Example 3

Conversion from a Non-Newtonian Form to a Newtonian Form

Small amplitude oscillatory measurement was conducted for the PQT-dispersion of Example 2, wherein the Non-Newtonian dispersion was heated at an elevated temperature from about 25° C. to about 65° C. with a temperature increment of about 2° C. Each increased temperature had an equilibration time of about 120 seconds.

Figure 4:
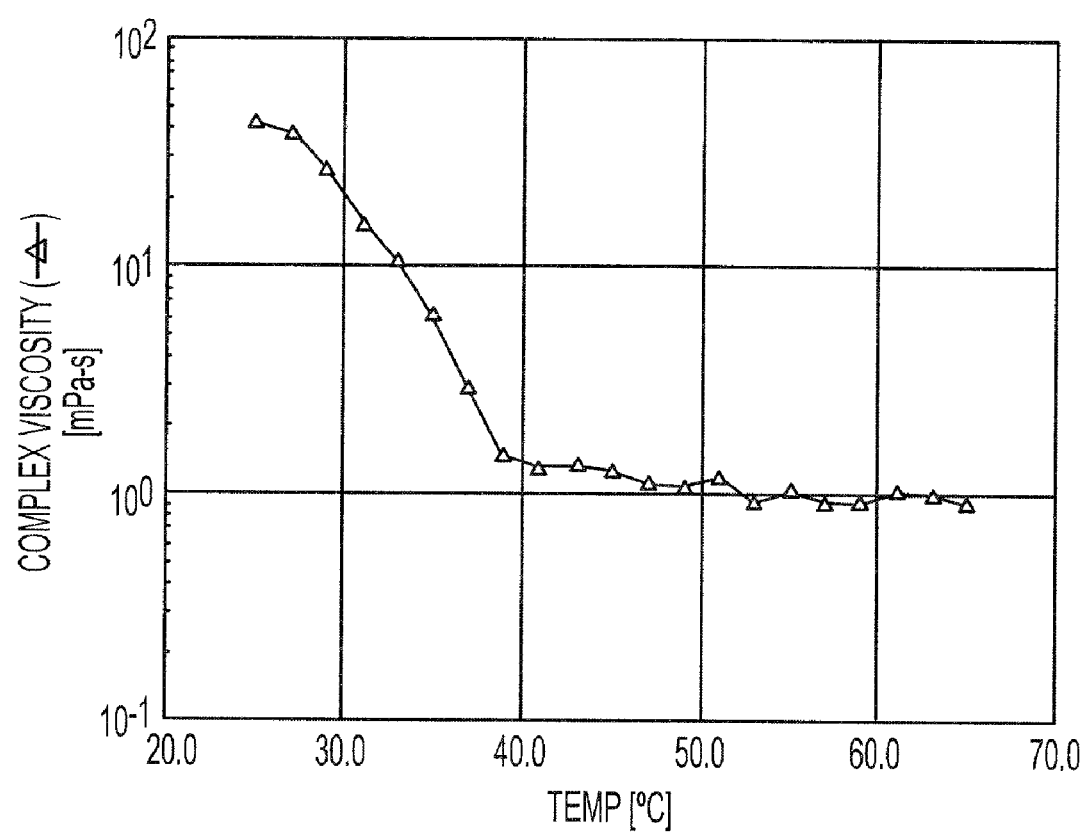
FIG. 4 depicts a conversion from non-Newtonian to Newtonian of an exemplary liquid composition in accordance with various embodiments of the present teachings.

During this rheological oscillatory measurement, a constant frequency of about 1 Hz was used. As shown in FIG. 4, when the PQT-dispersion was gradually heated from room temperature to about 40° C., the complex viscosity is gradually decreased. The complex viscosity however becomes constant once the temperature was increased at about 40° C. or greater, e.g., up to about 65° C. in this example, showing a Newtonian characteristic. In other words, the exemplary PQT-dispersion had a conversion temperature or a narrow conversion temperature range at around 40° C. for changing from a non-Newtonian dispersion into a Newtonian solution.

Example 4

Semiconductor Features Jetted at Non-Newtonian Form

Dimatix inkjet printer equipped with 10 pL cartridges was used in this comparative (or control) example. The print-head was set at room temperature. PQT-dispersion of Example 2 was deposited at a non-Newtonian form. A 4×4 cm dot-array spaced by 100 μm, and two straight lines each having single-drop width were designed and printed as examples.

Figure 5A:
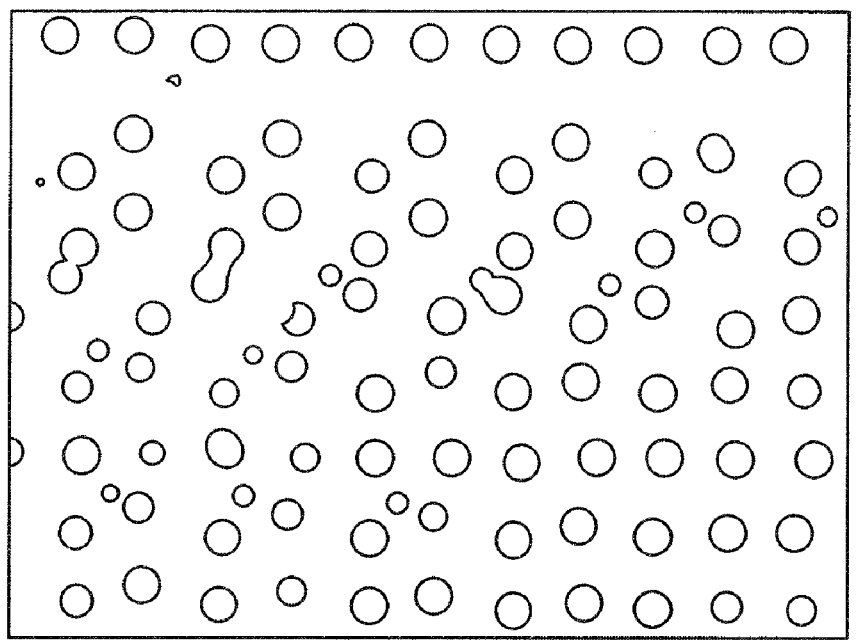
FIGS. 5A-5B schematically depict exemplary semiconductor features Jetted in a non-Newtonian form in accordance with various embodiments of the present teachings.
Figure 5B:
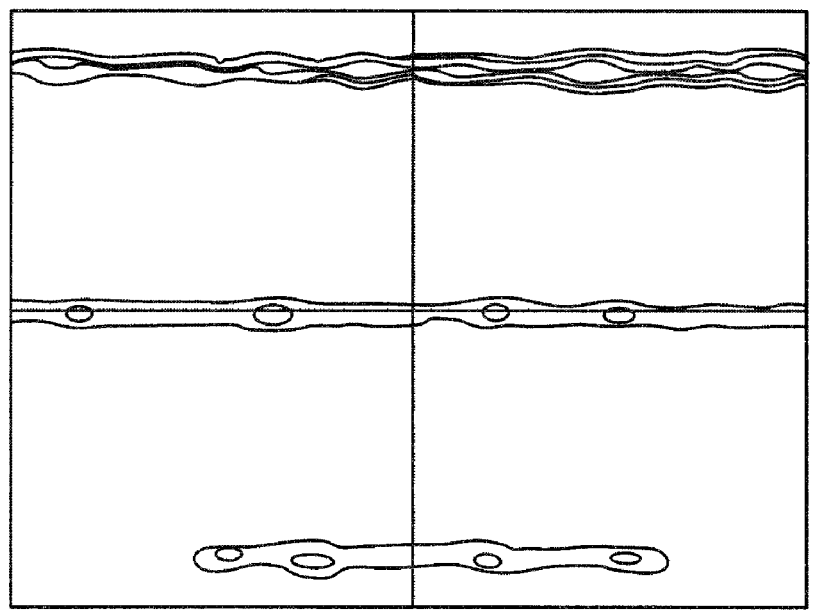

FIGS. 5A-5B depict exemplary semiconductor features Jetted at a non-Newtonian form in accordance with various embodiments of the present teachings.

Specifically, FIG. 5A schematically depicts the jetted results of dot-array. As shown, mis-directional deposition was observed although most of the area showed a regular dots array similar to the designed pattern. FIG. 5B schematically depicts the jetted results of thin lines. Rough edges and/or broken area were also observed for this non-Newtonian PQT-dispersion of Example 2.

Example 5

Semiconductor Features Jetted at Newtonian Form

In this example, same printer and cartridges were used as for Example 4. The print-head of the cartridges was set at 60° C., which is higher than the convention temperature as indicated by Example 3. Therefore, when the PQT-dispersion of Example 2 passed through the print-head, the particle dispersion can be changed into Newtonian solution that was then jetted out of the nozzles. Same patter designs shown in FIGS. 5A-5B were printed for comparison purpose.

Figure 6A:
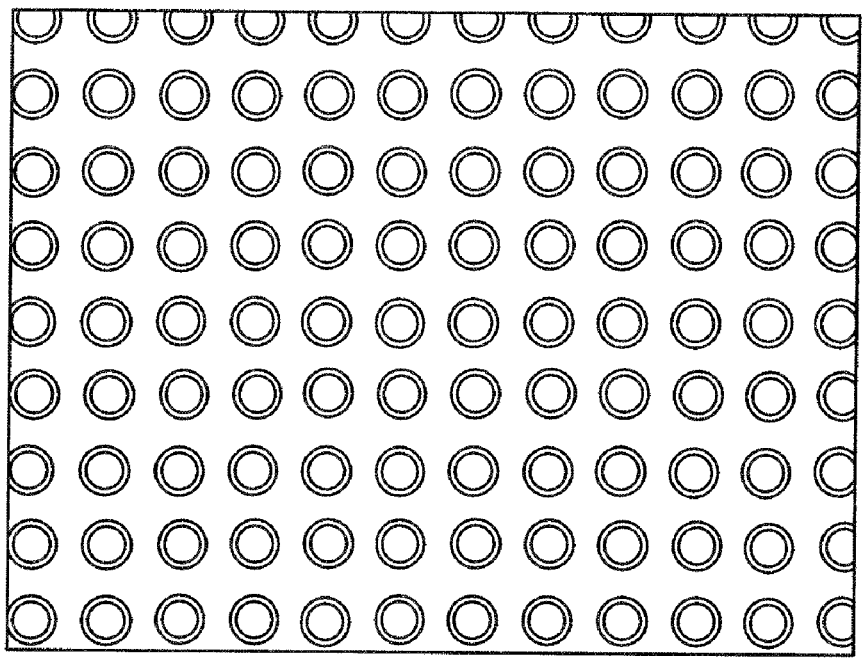
FIGS. 6A-6B schematically depict exemplary semiconductor features jetted in a Newtonian form in accordance with various embodiments of the present teachings.
Figure 6B:
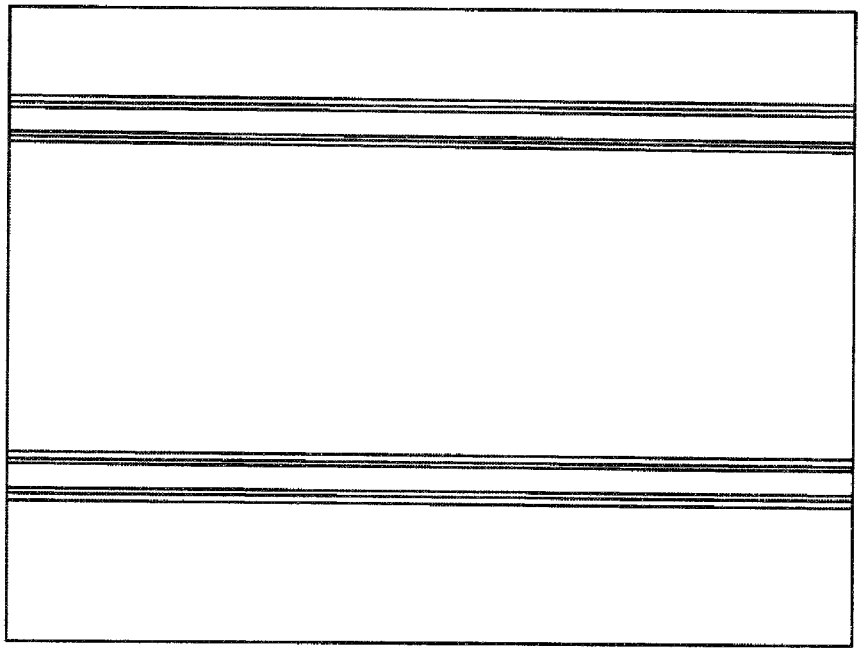

FIGS. 6A-6B depict exemplary semiconductor features jetted at a Newtonian form in accordance with various embodiments of the present teachings.

Specifically, FIG. 6A schematically depicts the jetted results of dot-array. As shown, no misfired drop was observed for the whole 4×4 cm array. FIG. 6B schematically depicts the jetted results of thin lines. As shown, the printed lines were observed to be smooth and uniform, without any broken area.

As compared with FIGS. 5A-5B, FIGS. 6A-6B indicates high quality semiconductor prints or semiconductor features achieved by using the disclosed processes and systems.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A process for forming a semiconductor feature comprising:
    determining a temperature at which a liquid composition undergoes a phase change from a non-Newtonian state to a Newtonian state;
    forming the liquid composition, the liquid composition comprising a plurality of organic semiconductor particles dispersed in a solvent, wherein the non-Newtonian liquid composition has a shelf-life of more than about two days;
    heating the liquid composition to at least the determined temperature to change the liquid composition from a non-Newtonian liquid to a Newtonian liquid and to uniformly dissolve the plurality of organic semiconductor particles in the solvent to form a Newtonian liquid composition; and
    depositing the Newtonian liquid composition onto a substrate to form one or more uniform semiconductor features on the substrate.

2. The process of claim 1, wherein the heating step is performed by a heater configured with a print-head for heating the liquid composition that passes the print-head to have a constant viscosity.

3. The process of claim 1, wherein the liquid composition is heated at a temperature elevated from about 40° C. to about 120° C.

4. The process of claim 1, wherein at least about 30% of the plurality of semiconductor particles are nano-aggregates.

5. The process of claim 1, wherein the plurality of organic semiconductor particles have a formula of:

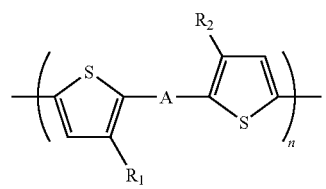

wherein n is from 2 to about 5,000; R1 and R2 is independently selected from the group consisting of hydrogen, alkyl, arylalkyl, alkylaryl, perhaloalkyl, alkoxyalkyl, siloxy-substituted alkyl, polyether, alkoxy, and halogen; and A is a divalent linkage selected from the group consisting of:

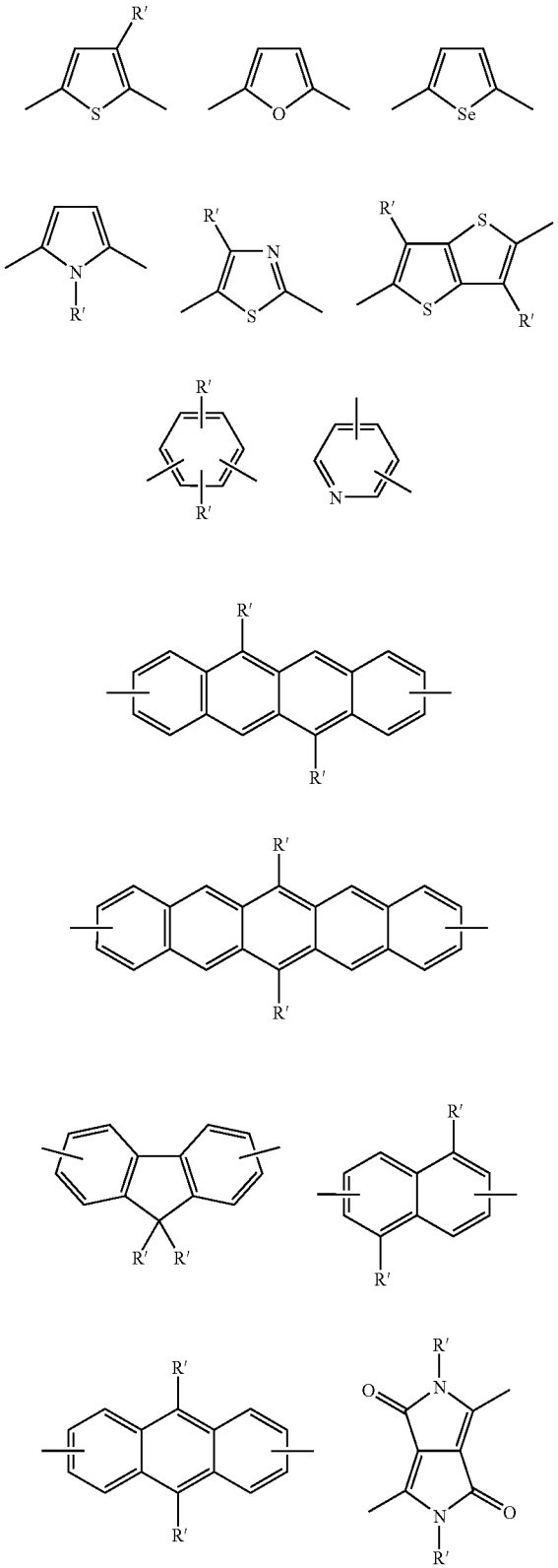

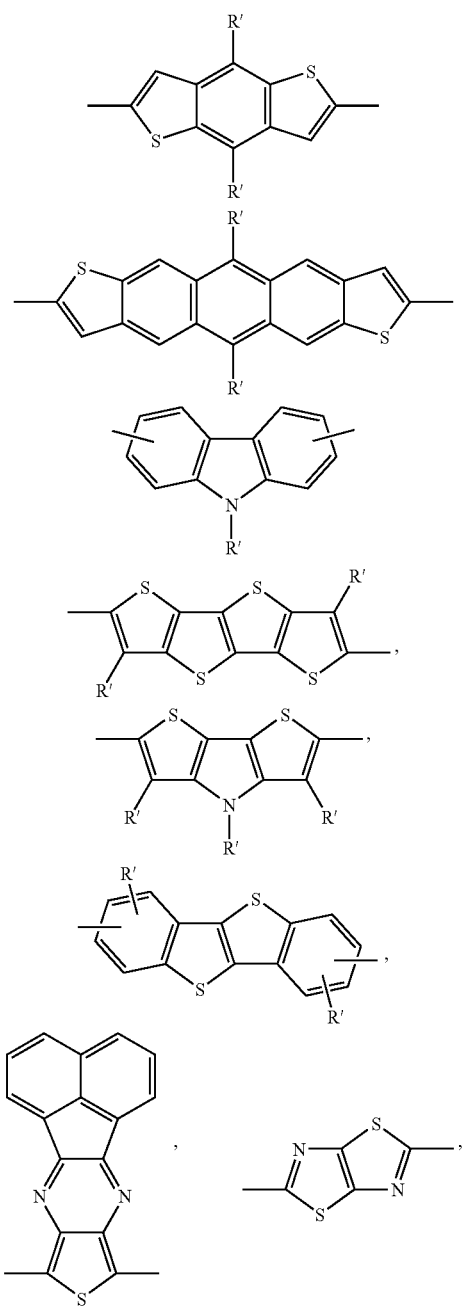

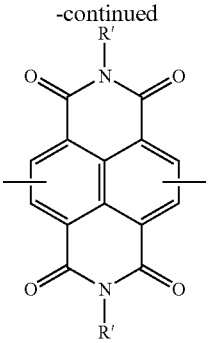

and combinations thereof, and wherein each R' is independently selected from the groups consisting of hydrogen, alkyl, substituted alkyl, aryl, substituted aryl, heteroaryl, halogen, —CN, and —NO$_2$.

6. The process of claim 1, wherein the one or more semiconductor features are features formed for a transistor, sensor, light emitting diode, or photovoltaic device.

7. The process of claim 1, wherein depositing the Newtonian liquid composition onto the substrate further comprises printing or coating the Newtonian liquid composition onto the substrate to uniformly deposit the Newtonian liquid composition.

8. The process of claim 1, wherein the depositing further comprises inkjet printing.

9. The process of claim 1, wherein the heating is performed for less than about 30 minutes to change the liquid composition from the non-Newtonian liquid to the Newtonian liquid.

10. The process of claim 1, wherein at least about 30% of the plurality of organic semiconductors dispersed in the solvent are nano-aggregates.

11. The process of claim 1, wherein the liquid composition in the Newtonian state is substantially absent of aggregates of the one or more organic semiconductors.

12. The process of claim 1, further comprising depositing the liquid composition according to an array design to form the one or more uniform semiconductor features, wherein each semiconductor feature has an offset from an original design of the array design, the offset ranging from 0 to about 30 microns.

13. The process of claim 1 wherein the depositing of the Newtonian liquid further comprises depositing the Newtonian liquid composition onto the substrate when the substrate is at a temperature ranging from about 0 to about 120° C.

* * * * *